United States Patent [19]

Okada et al.

[11] 3,840,754

[45] Oct. 8, 1974

[54] PHASE COMPARING CIRCUIT

[75] Inventors: Takashi Okada, Yamato; Hiroyuki Sumiya, Tokyo, both of Japan

[73] Assignee: Sony Corporation, Tokyo, Japan

[22] Filed: Apr. 4, 1973

[21] Appl. No.: 347,710

[30] Foreign Application Priority Data

Apr. 6, 1972 Japan .............................. 47-34732

[52] U.S. Cl. .................. 307/257, 307/254, 307/255

[51] Int. Cl. ........................................ H03k 17/00

[58] Field of Search ............ 307/257, 254; 328/208

[56] References Cited

UNITED STATES PATENTS

| | | | |
|---|---|---|---|
| 3,222,547 | 12/1965 | Boan et al. | 307/257 X |
| 3,284,641 | 11/1966 | St. John | 307/257 X |
| 3,573,501 | 4/1971 | Diehl | 307/257 |

*Primary Examiner*—Rudolph V. Rolinec
*Assistant Examiner*—B. P. Davis
*Attorney, Agent, or Firm*—Lewis H. Eslinger; Alvin Sinderbrand

[57] ABSTRACT

A phase comparing circuit in which four diodes constituting a bridge circuit which operates as a signal gate circuit and is supplied with an input signal to and delivers an output signal from a pair of opposite junctions of the bridge circuit. The signal gate circuit is controlled by a pair of constant current switching devices connected to another pair of junctions of the bridge circuit and the control switching devices are controlled by a control signal such that the absolute value of the output current is maintained constant regardless of the value of the input signal, and the output signal is obtained across a capacitor as a phase compared signal between the input signal and the control signal.

9 Claims, 4 Drawing Figures

PHASE COMPARING CIRCUIT

BACKGROUND OF THE INVENTION

1. Field of the Invention

This invention relates generally to a phase comparing circuit and more particularly to such a circuit which utilizes a diode gate or bridge circuit and is suitable for use in an integrated circuit network.

2. Description of the Prior Art

Phase comparing circuits are widely used in many different kinds of electronic equipment.

Television receivers, for example, employ such a phase comparing circuit in an automatic frequency control circuit for a horizontal oscillator circuit.

But such conventional circuitries using diode gate circuits usually require a number of capacitors whose capacitance value is relatively large. So if such circuits are to be formed in an integrated circuit, a number of external terminals must be provided for connecting external capacitors of large capacitance value.

One type of phase comparing circuit utilizing a series connected diode gate circuit is described in U.S. Pat. No. 3,678,185 entitled "SEMICONDUCTOR CIRCUIT FOR PHASE COMPARISON" granted July 18, 1972 to the assignee of this application. However the diode gate circuit described therein does not provide means for maintaining the absolute value of the output current constant regardless of the value of the input signal.

SUMMARY OF THE INVENTION

The phase comparing circuit utilizing a diode bridge circuit according to this invention includes four diodes which are connected to form a bridge circuit with a signal input terminal and a signal output terminal respectively connected to a pair of opposite junctions thereof. A pair of constant current switching devices are connected to separate ones of another pair of junctions of the bridge circuit and the constant current switching devices simultaneously switched on and off by a control signal supplied thereto. When the bridge circuit is made operative by the pair of switching devices controlled by the control signal the absolute value of the output current is maintained constant regardless of the value of the input signal. Therefore, the circuits operate symmetrically in correspondence with a positive going or negative going input signal and a symmetrical output signal obtained from the output terminal across a capacitor.

Accordingly, if the phase comparing circuit is used as an AFC circuit in a horizontal oscillator of a television receiver, the output signal can be obtained with improved signal-to-noise ratio, and further since the absolute value of the output current is not influenced by the value of input signal, the circuit can be designed with a constant power consumption or relatively little power consumption.

Accordingly, it is an object of this invention to provide a novel phase comparing circuit utilizing a diode bridge circuit avoiding the above mentioned disadvantages inherent in the prior art.

It is another object of this invention to provide a novel diode gate circuit which is suitable for using in the form of an integrated circuit.

The foregoing and other objectives, features, and advantages of the invention will be more readily understood upon consideration of the following detailed description of certain preferred embodiments of the invention, taken in conjunction with the accompanying drawings.

DESCRIPTION OF CERTAIN PREFERRED EMBODIMENTS

Figure 1:
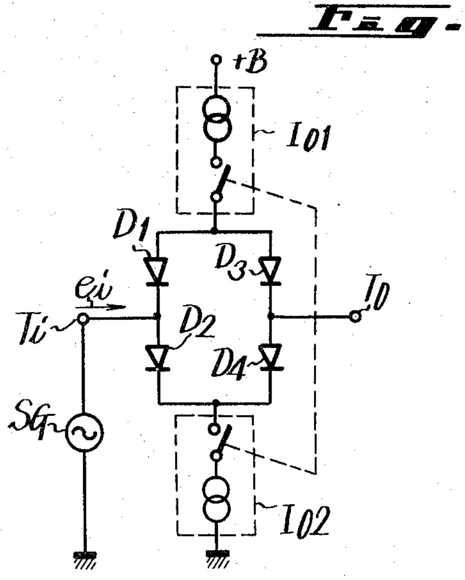
FIG. 1 is a fundamental schematic diagram for illustrating a diode bridge circuit utilized in a phase comparing circuit according to this invention.

In FIG. 1 for illustrating a theoretical connection of a diode gate circuit utilized in a phase comparing circuit according to this invention, reference characters $D_1$, $D_2$, $D_3$ and $D_4$ respectively designate diodes, $S_G$ a signal source, $I_{01}$ and $I_{02}$ first and second constant current switches (to be explained in greater detail hereinafter), $T_i$ an input terminal and $T_o$ an output terminal. The diodes $D_1$ and $D_2$ are connected together in series and are connected in parallel with the series connection of the diodes $D_3$ and $D_4$. The anodes of the diodes $D_1$ and $D_3$ are connected through the constant current switch $I_{01}$ to a +B source and the cathodes of the diodes $D_2$ and $D_4$ are connected through the constant current switch $I_{02}$ to the circuit ground. The input terminal $T_i$ is connected to the junction of the cathode of the diode $D_1$ with the anode of the diode $D_2$. The output terminal is connected to the junction of the cathode of the diode $D_3$ with the anode of the diode $D_4$.

As shown in FIG. 1 the first and second constant current switch $I_{01}$ and $I_{02}$ are ganged with each other, and are connected to a pair of opposite junctions of a diode bridge circuit, while a signal input circuit and a signal output circuit are connected to the other pair of opposite junctions at terminals $T_i$ and $T_o$, respectively. The first and second constant current switches $I_{01}$ and $I_{02}$ are controlled to be ON and OFF simultaneously with a control signal.

When the constant current switches $I_{01}$ and $I_{02}$ are both in the OFF state, an input signal $e_i$ is not transmitted to the output terminal $T_o$. When the constant current switches $I_{01}$ and $I_{02}$ are made conductive with a sampling pulse signal or a synchronizing signal to act as constant current circuits, respectively, the respective diodes $D_1$, $D_2$, $D_3$ and $D_4$ operate as current switching elements for the input signal $e_i$, to deliver a sampled signal to the output terminal $T_o$.

With the circuit shown in FIG. 1, if currents from the constant current switches $I_{01}$ and $I_{02}$ are selected to be equal with each other, a driving current for making the diode gate circuit ON or OFF does not leak to the outside of the diode gate circuit to correctly and positively transmit the input signal to the output side thereof.

Figure 2:
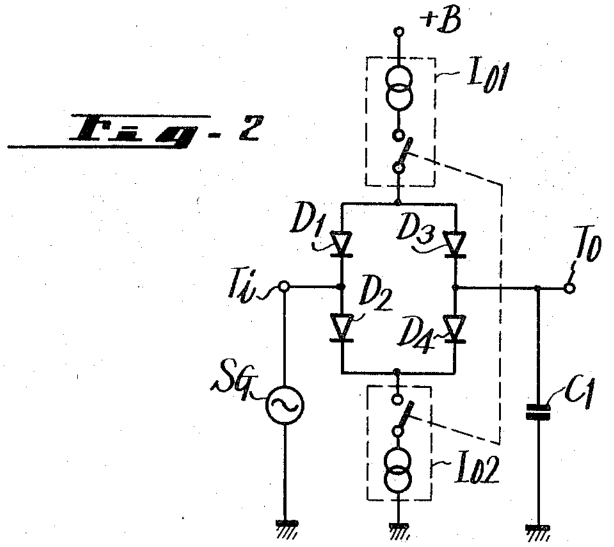
FIG. 2 is a schematic diagram for illustrating a fundamental phase comparing circuit according to this invention.

FIG. 2 shows a fundamental phase comparing circuit according to this invention which includes the diode gate circuit depicted in FIG. 1 and the references used in FIG. 2 designate similar elements to those in FIG. 1. In the embodiment of FIG. 2 a capacitor $C_1$ is inserted between the output terminal $T_o$ and the earth. If it is assumed that a voltage of the signal source $S_G$ at a certain phase is taken as $V_i$ and the initial charge voltage of the capacitor $C_1$ when the constant current switches $I_{01}$ and $I_{02}$ are turned ON is taken as $V_o$, the following operation is achieved.

1. In the case of $V_i > V_o$:

A constant current $I_0$ flows into the capacitor $C_1$ from the first constant current source $I_{01}$ to charge up the capacitor $C_1$ to a voltage equal to $V_i$. Simultaneously the signal source $S_G$ applies the constant current $I_0$ to the second constant current switch $I_{02}$.

2. In the case of $V_i > V_o$:

The charge stored in the capacitor $C_1$ is discharged to the second constant current switch $I_{02}$ to make $V_o$ equal in voltage to $V_i$. The discharging current is controlled by the second constant current switch $I_{02}$ as the constant current $I_0$. Simultaneously the first constant current switch $I_{01}$ supplies the constant current $I_0$ to the signal source $S_G$.

Thus, with the phase comparing circuit shown in FIG. 2 an output voltage equal to $V_i$ of the input signal is always derived from the output terminal $T_o$. And further the currents from the constant current switches $I_{01}$ and $I_{02}$ are selected to be equal to each other and the phase detector circuit will be balanced and will produce an output signal containing no error signal at its output terminal $T_o$.

Figure 3:
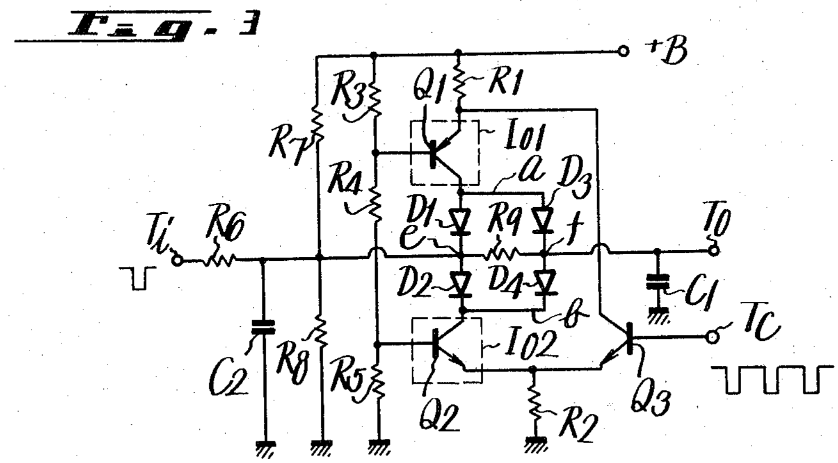
FIGS. 3 and 4 are respectively schematic diagrams in which the phase comparing circuit of this invention is used in an AFC circuit in the horizontal scanning section of a television receiver.

FIG. 3 shows a practical embodiment of the circuit according to the invention in which the circuit of the invention is employed in an AFC circuit in the horizontal scanning section of a television receiver and references similar to those of FIGS. 1 and 2 designate similar elements. In the embodiment of FIG. 3 a PNP-type transistor $Q_1$ and an NPN-type transistor $Q_2$ constitute the first and second constant current switches $I_{01}$ and $I_{02}$, respectively, and an NPN-type transistor $Q_3$ serves as an ON-OFF controlling transistor for the transistors $Q_1$ and $Q_2$. That is, the collector electrode of the transistor $Q_1$ is connected to a junction *a* at the anodes of the diodes $D_1$ and $D_4$ while its emitter electrode is connected through a resistor $R_1$ to a plus voltage source +B.

The collector electrode of the transistor $Q_2$ is connected to a junction *b* at the cathodes of the diodes $D_2$ and $D_3$ while its emitter electrode is grounded through a resistor $R_2$. The transistor $Q_3$ is connected at its collector electrode to the emitter electrode of the transistor $Q_1$, at its emitter electrode to the emitter electrode of the transistor $Q_2$ and at its base electrode to a control signal input terminal $T_c$. A plurality of resistors $R_3$, $R_4$ and $R_5$ are connected in series between the plus voltage source +B and the circuit ground for biasing the transistors $Q_1$ and $Q_2$ at constant voltages. The base electrodes of the transistors $Q_1$ and $Q_2$ are respectively connected to the connection point between resistors $R_3$ and $R_4$ and to the connection point between resistors $R_4$ and $R_5$.

The junction between the cathode of the diode $D_1$ and the anode of the diode $D_2$ is designated *e*. The junction between the cathode of the diode $D_3$ and the anode of the diode $D_4$ is designated *f*. The input terminal $T_i$ is connected to the junction *e* through a resistor $R_6$ and a capacitor $C_2$ is inserted between the junction *e* and the circuit ground; the resistor $R_6$ and the capacitor $C_2$ forming an integrating circuit. The connection point between resistors $R_7$ and $R_8$, which are connected in series between the +B voltage source and the circuit ground, is connected to the junction *e* of the diode bridge. A resistor $R_9$ is inserted between opposing junctions *e* and *f* of the diode bridge.

With the circuit shown in FIG. 3, a horizontal flyback pulse fed to the input terminal $T_i$ is integrated by the circuit consisting of the resistor $R_6$ and the capacitor $C_2$ to form a sawtooth wave. The sawtooth wave thus obtained is superposed on the voltage divided by the resistors $R_7$ and $R_8$ and then applied to the junction *e* of the diode bridge. If the control signal input terminal $T_c$ is supplied with a pulse train, horizontal synchronizing signal of negative polarity at this time, the transistor $Q_3$ is made OFF during the period of every synchronizing pulse to make the transistors $Q_1$ and $Q_2$ ON, respectively. Accordingly, the voltage of the sawtooth wave applied during the period of every synchronizing pulse is obtained at the output terminal $T_o$.

The thus obtained sampling signal integrated by the capacitor $C_1$ produce a control signal for controlling the oscillation frequency of a horizontal oscillation circuit. The resistor $R_9$ acts to transmit a bias voltage produced by the resistors $R_7$ and $R_8$ and the average voltage of the input signal to the output side of the circuit during periods other than the period of every synchronizing pulse and is not an indispensable element in constructing the invention, but it is useful for the AFC circuit mentioned above, especially during periods when the control signal is absent.

Figure 4:
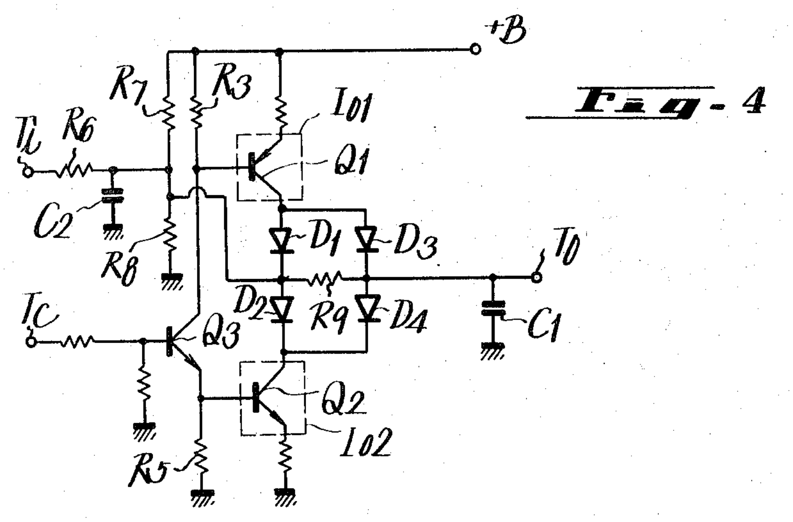

FIG. 4 shows another embodiment of the invention in which references similar to those of the foregoing figures represent similar components. In this embodiment, the collector-emitter junction of the transistor $Q_3$ replaces the resistor $R_4$ in the embodiment shown in FIG. 3 and is connected between the base electrodes of the transistors $Q_1$ and $Q_2$, which constitute the first and second constant current switches $I_{01}$ and $I_{02}$. The remaining construction and operation of this embodiment are substantially the same as those of the embodiment shown in FIG. 3, so that the description thereof will be omitted for the sake of brevity.

With the phase comparing circuit of this invention described as above, an error in the currents from the constant current switches $I_{01}$ and $I_{02}$ may be caused by relative errors of the resistors for setting current value. However, when the circuit is formed as an integrated circuit, the relative errors of resistors are greatly reduced, which means that this invention may be preferable for use with an integrated circuit.

Further, the number of external parts to be connected to an integrated circuit embodying this invention and the number of terminals for such external parts are fewer as compared with those of conventional balanced double pulse AFC and unbalanced single pulse AFC circuits.

The above description is given for the case where this invention is employed in the AFC circuit in horizontal scanning of a television receiver, but it will be easily understood that this invention can also be used in a circuit such as, for example, a signal sampling circuit and so on.

The terms and expressions which have been employed here are used as terms of description and not of limitation, and there is no intention in the use of such terms and expressions, of excluding equivalents of the features shown and described, or portions thereof, it being recognized that various modifications are possible within the scope of the invention claimed.

We claim as our invention:

1. A phase comparing circuit, comprising:

first and second circuit means each including a plurality of series connected diodes, the series connected diodes in each of the first and second circuit means having the same direction of conductive polarity;

means for connecting the first and second circuit means in parallel;

first and second constant current switching transistors for passing equal currents only when rendered conductive;

a voltage supply source including a pair of terminals, means connecting the first switching transistor, the parallel connection of the first and second circuit means and the second switching transistor in a series circuit between said pair of terminals;

control means including a control signal source for controlling the first and second switching transistors simultaneously so that the first and second switching transistors are selectively rendered conductive at the same time whereby substantially equal currents flow therethrough and current flows in said series circuit only at said time;

means for supplying an input signal to a connection point between the series connected diodes in the first circuit means, the control signal supplied by the control signal source having a frequency corresponding to that of the input signal;

an output terminal connected to a connection point between the series connected diodes in the second circuit means; and a capacitor connected between said output terminal and one of said voltage supply source terminals, so that an output signal representing the phase difference between said input and said control signals is derived from said output terminal as the charge across said capacitor.

2. A phase comparing circuit as recited in claim 1, wherein resistive means are connected between the connection points of the diodes in said first and second circuit means.

3. A phase comparing circuit as recited in claim 1 wherein the first and second transistors have first, second and third electrodes respectively and the respective paths between the second and third electrodes are included in the series circuit and the first electrodes are simultaneously supplied with the control signal.

4. A phase comparing circuit as recited in claim 3 wherein the first, second and third electrodes are respectively the base, emitter and collector electrodes of the respective transistors.

5. A phase comparing circuit as recited in claim 4 wherein said control means further includes a third transistor having a base electrode for receiving the control signal, a collector electrode connected to the base electrode of one of said first and second switching transistors and an emitter electrode connected to the base electrode of the other of said first and second switching transistors.

6. A phase comparing circuit as recited in claim 1 wherein the first and second transistors have first, second and third electrodes respectively and the respective paths between the second and third electrodes are included in the series circuit and the second electrodes are simultaneously supplied with the control signal.

7. A phase comparing circuit as recited in claim 6 wherein the first, second and third electrodes are respectively the base, emitter and collector electrodes of the respective transistors.

8. A phase comparing circuit as recited in claim 7 wherein said control means further includes a third transistor having a base electrode for receiving the control signal, a collector electrode connected to the emitter electrode of one of said first and second switching transistors and an emitter electrode connected to the emitter electrode of the other of said first and second switching transistors.

9. A phase comparing circuit as recited in claim 1 wherein the first and second transistors are of opposite conductivity.

* * * * *